United States Patent [19]

Mitsuhashi et al.

[11] Patent Number: 4,549,300
[45] Date of Patent: Oct. 22, 1985

[54] SEMICONDUCTOR LASER DEVICE

[75] Inventors: Yoshinobu Mitsuhashi; Junichi Shimada, both of Ibaraki, Japan

[73] Assignees: Agency of Industrial Science and Technology; Ministry of International Trade and Industry, both of Tokyo, Japan

[21] Appl. No.: 477,856

[22] Filed: Mar. 22, 1983

[30] Foreign Application Priority Data

Jun. 24, 1982 [JP] Japan ................. 57-109047

[51] Int. Cl.[4] .............................. H01S 3/19
[52] U.S. Cl. ........................ 372/50; 372/27; 372/92; 372/106
[58] Field of Search ............ 372/49, 50, 92, 106, 372/26, 27

[56] References Cited

U.S. PATENT DOCUMENTS 3,999,146  12/1976  Lang et al. ................. 372/50
4,079,339   3/1978  Kobayashi et al. .......... 372/29
4,485,474  11/1984  Osterwalder ............... 372/44
4,503,541   3/1985  Weller et al. .............. 372/92

OTHER PUBLICATIONS

Tang et al., "Wide-bank Electro-optical Tuning of Semiconductor Lasers", *Applied Physics Letters*, vol. 30, No. 2, Jan. 15, 1977, pp. 113–116.
Fleming et al., "Spectral Characteristics of External-Cavity Controlled Semiconductor Lasers", IEEE JQE, vol. QE-17, No. 1, Jan. 1981, pp. 44–59.

*Primary Examiner*—James W. Davie
*Attorney, Agent, or Firm*—Oblon, Fisher, Spivak, McClelland & Maier

[57] ABSTRACT

In a semiconductor laser device wherein the laser beam emitted from an output end face of a semiconductor laser having antireflection coating for the opposite output end faces thereof is returned back to the output end face to induce self-coupling effects of the laser beam, the polarization characteristics of the output beam from the semiconductor laser are changed by controlling the polarization characteristics of the return beam.

3 Claims, 13 Drawing Figures

SEMICONDUCTOR LASER DEVICE

BACKGROUND OF THE INVENTION

This invention relates to a semiconductor laser device capable of easily controlling the polarization characteristics of the output light.

Optical communiation and measurement using semiconductor lasers have come to find acceptance for practical use. The semiconductor lasers have characteristic features such as small size and light weight, low working voltage, high operational efficiency, and direct quick modulation as compared with other lasers. Now that improvements in service life, reliability and output are making steady progress, there is a high probability that the price of semiconductor lasers will fall as mass production and range of applications are expanded.

Recently, a polarization-preserving optical fiber has been developed and optical communication making use of a multiplicity of planes of polarization has been proposed. Further as studies are progressing on an optical fiber interferometer using a semiconductor laser as a light source and on use of long optical fibers as sensors such as for temperature, pressure, and magnetic field, the polarization-plane characteristics of the output light of semiconductor lasers have come to attract the attention of researchers.

With the ordinary gas laser, it is customary to obtain a straight polarized output by regulating the plane of polarization of the output light by means of a discharge tube incorporating therein Brewster windows. In this case, the polarization ratio defined as the ratio of the intensity of the main component of polarized radiation to the intensity of the component of polarized radiation perpendicularly intersecting the main component is obtained on the order of 1000 to 1. In contrast, with the semiconductor laser, the cleaved facet of the semiconductor crystal is used as the reflecting face for the resonator and the polarization characteristic based on the anisotropy of reflectance on the cleaved facet are utilized. Because the ability of the cleaved facet to control the polarization is smaller than that of the Brewster window, the polarization ratio of the output light from the semiconductor laser normally falls on the order of 20 through 30 to 1, and 100 to 1 at most.

SUMMARY OF THE INVENTION

An object of this invention is to provide a semiconductor laser device which has the polarization ratio of its output light notably improved by utilizing the self-coupling effects of the semiconductor laser.

Another object of this invention is to provide a semiconductor laser device which makes it possible to obtain a straight polarized output in the direction perpendicular to the direction of polarization of the output light obtainable by the conventional semiconductor laser, to obtain simultaneously two straight polarized outputs in directions perpendicularly intersecting each other, or to effect quick switching between the two polarized outputs.

Specifically, the semiconductor laser device of the present invention comprises a semiconductor laser of the type having antireflection coating on the opposite end faces, a power source for controlling the injection current into the semiconductor laser, an optical system for returning the light issuing from the outlet end face of the semiconductor laser back to the same end face thereby inducing self-coupling effects, and an element for controlling the plane of polarization of the light being returned within the aforementioned optical system. By changing the angle of the plane of polarization of the light returned to the semiconductor laser by means of the aforementioned element, the output light can be polarized simultaneously in the two directions, one parallel to and the other perpendicular to the plane of the p-n junction, or selectively in either of these two directions.

The other objects and characteristic features of the present invention will become apparent to those skilled in the art as the disclosure is made in the following description of a preferred embodiment of the invention, as illustrated in the accompanying drawings.

DESCRIPTION OF PREFERRED EMBODIMENT

Figure 1:
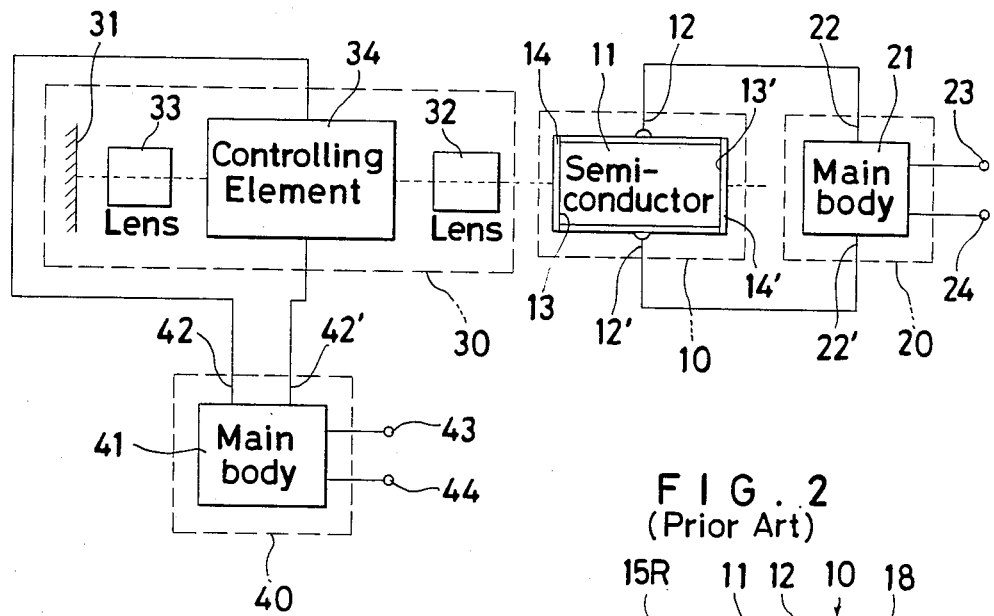
FIG. 1 is a block diagram illustrating a typical construction of the semiconductor laser device of the present invention.

FIG. 1 is a block diagram illustrating a typical construction of the semiconductor laser device of the present invention. As illustrated therein, the semiconductor laser device comprises a semiconductor laser 10, a power source 20 for controlling the injection current to be used for operating the semiconductor laser, an optical system 30 laid out so as to regulate the path of the light issuing from the semiconductor laser 10, and a control circuit 40 adapted to control an element 34 disposed within the optical system 30 and adapted to control the polarization characteristics of the return light.

The semiconductor laser 10 is provided with a semiconductor 11 containing a p-n junction, a pair of electrode terminals 12, 12' joined to the semiconductor 11, and a pair of end faces 13, 13' disposed on the opposite ends of the semiconductor 11 and jointly constituting a laser resonator. To the pair of end faces are applied fast antireflection coats 14, 14' formed by depositing transparent dielectric to a thickness equaling about one fourth of the wavelength of oscillation, so as to lower the reflectance of the end faces 13, 13' to below 0.1.

Figure 2:
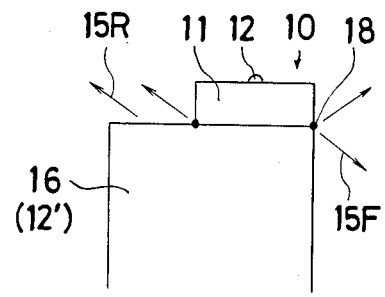
FIG. 2 is a side view of one conventional semiconductor laser.
Figure 3:
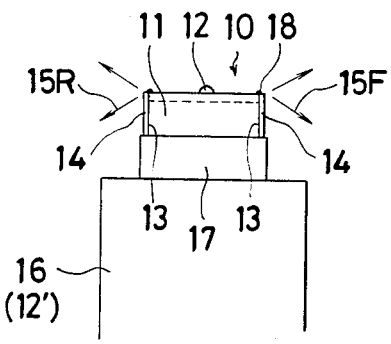
FIG. 3 is a side view illustrating a typical semiconductor laser to be used in the semiconductor laser device of the present invention.

In the conventional semiconductor laser 10, since it was mounted so that the p-n junction boundary 8 destined to serve as a light-emitting member would fall on the heatsink 16 side as illustrated in FIG. 2, the rear light output 15R from the semiconductor laser was intercepted and reflected by the heatsink 16. In the present invention, the semiconductor laser 10 of the aforementioned construction is mounted on a small sub-heatsink 17 resting on a heatsink 16 in such a manner that the light-emitting member of the semiconductor laser 10 will fall on the upper side as illustrated in FIG. 3. Thus, the p-n junction boundary 18 destined to constitute the light-emitting member falls opposite the sub-heatsink 17. By mounting the semiconductor laser on the sub-heatsink as described above, the front light output 15F and the rear light output 15R emitting from the semiconductor laser 10 can be utilized without experiencing any interception.

The power source 20 comprises a main body 21, a pair of lead wires 22, 22' connecting the main body to the semiconductor laser 10, and terminals 23, 24 for admitting signals which are used for controlling the operation of the main body 21.

The optical system 30 comprises a mirror 31 and lenses 32, 33 jointly serving to return part of the light emitted from the end face 13 of the semiconductor laser 10 back to the same end face and an element 34 for effecting the control of the polarization characteristics of the return light which constitutes an important operation for the present invention.

The control circuit 40 comprises a main body 41, a pair of lead wires 42, 42' serving to connect the main body 41 to the element 34 controlling the polarization characteristics of the return light, and terminals for admitting signals to be used for controlling the operation of the main body 41.

Now, the operation of the semiconductor laser device of this invention which is constructed as described above will be explained below.

First a prescribed injection current is fed from the power source 20 to the semiconductor laser 10 which has antireflection coats 14, 14' at the opposite end faces. Consequently, there is emitted a light which is called spontaneous emission. The light emitted from the end face 13 and collimated by the lens 32 is passed through the element 34 serving to control the polarization characteristics of the return light and focused through the lens 33 onto the mirror 31. The light reflected by the mirror 31 is then returned to the end face 13 of the semiconductor laser 10 by reversely advancing the light along the path mentioned above. The semiconductor laser 10 is oscillated by the return light. The direction in which the output laser beam is polarized is regulated by the element 34 serving to control the polarization characteristics of the return light.

When the plane of polarization of the return light is parallelized to the plane of the p-n junction of the semiconductor laser 10, the laser beam is generated in that direction of polarization. When the plane of polarization of the return light is made to intersect perpendicularly the plane of the p-n junction of the semiconductor laser 10, the laser beam is generated in that direction of polarization. When the plane of polarization of the return light is inclined by a certain angle $\theta(0°<\theta<90°)$ so that it will run neither parallelly to the plane of p-n junction (to be defined as an angle of 0°) nor perpendicularly thereto (to be defined as an angle of 90°), the direction of polarization of the output laser beam will not fall in the $\theta$ direction. When the angle $\theta$ of the inclination falls in the range of $0°<\theta<45°$, the output laser beam is polarized in a direction parallel to the plane of the p-n junction ($\theta=0°$). When the angle $\theta$ of the inclination is larger than 45° by some extent, the output laser beam is polarized in a direction perpendicular to the plane of the p-n junction ($\theta=90°$).

By selecting the direction of polarization ($\theta$) of the return light at a suitable angle ($45°<\theta<90°$), therefore, the output laser beam can be made to produce a polarized light simultaneously containing two mutually perpendicularly intersecting components, one parallel and the other perpendicular to the plane of the p-n junction.

This phenomenon is based on the interaction of stimulated emission occurring at the semiconductor laser 10 between the injection current carrier and the return light. It is termed herein as the self-coupling effect of the semiconductor laser 10.

Here, the self-coupling effects obtained by the use of the conventional semiconductor laser will be described.

The conventional semiconductor laser, though constructed similarly to the semiconductor laser 10 illustrated in FIG. 1, has no antireflection coat on the opposite end faces and incorporates no element for the control of the polarization characteristics of the return light.

Figure 4:
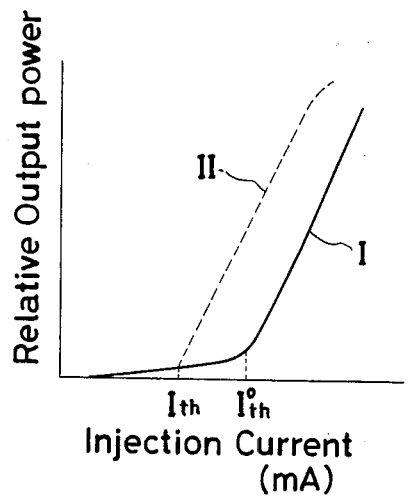
FIG. 4 is a graph showing the self-coupling effects obtained by use of the conventional semiconductor laser.

As the semiconductor laser is constructed as described above, the light output of the semiconductor laser is increased by virtue of the return light as indicated by the curve II of FIG. 4 compared with the curve I which represents the light output obtained in the absence of the return light. In the graph of FIG. 4, the horizontal axis is the scale for injection current and the vertical axis is that for relative value of light output. The reasons for the increase in the light output is that the value of the threshold current of laser generation which is defined by the injection current near the bend of the characteristic curve of light output vs. injection current is lowered by the return light. This fact indicates that even where the injection current is lower than the threshold current solely of the semiconductor laser (indicated as I°th in the graph of FIG. 4), there still exists spontaneous emission and this spontaneous emission, when returned to its origin by an external optical system, can attain growth to laser generation.

When a semiconductor laser which has no antireflection coat on the opposite end faces is used in the semiconductor laser device of the construction illustrated in FIG. 1, namely the construction incorporating the element 34, the polarization of the output laser beam invariably occurs in the direction of polarization of the output laser beam solely from the semiconductor laser, namely in the direction parallel to the plane of the p-n junction 18, no matter how the plane of polarization of the return light may be changed.

This phenomenon may be logically explained by the following postulate.

In the gas laser, the gain medium is isotropic so that the direction of the polarization of the output may be regulated freely and can be fixed by means of a Brewster window. If the Brewster window should be rotated about the optical axis, then the polarization of the output laser beam would be allowed to follow this rotation and might be obtained in any desired direction.

In the semiconductor laser, however, the gain medium is not isotropic but has an optical waveguide structure of the shape of a square. Thus, the directions of polarization which the laser output can assume are limited to the two directions, one parallel to and the other perpendicular to the plane of the p-n junction. The laser outputs in these two directions correspond to those which are referred to respectively as TE mode and TM mode.

The semiconductor laser uses the cleaved facet of its crystal as the reflecting mirror which constitutes a laser resonator. In the case of the GaAlAs laser which radiates a near-infrared beam, the reflectance of the cleaved facet of its crystal is about 0.32. The polarized beams of TE mode and TM mode have different reflectances, the former's being higher than the latter's.

In the semiconductor laser which is not provided with the antireflection coating, therefore, the polarized beam of TE mode is more liable to attain growth into laser radiation than that of TM mode. Generally, accordingly, the polarization output referred to as TE mode is more generally obtained than that referred to as TM mode. The polarization ratio of the output laser beam is the ratio of the intensity of TE mode light to that of TM mode light. As already pointed out, this ratio generally falls in the range of 20 to 1 to 30 to 1 and seldom reaches the level of 100 to 1.

In contrast, in the semiconductor laser of the type having antireflection coating on the opposite end faces which is used in the present invention, the reflectance at the end faces is even less than 0.10 and, consequently, the difference of reflectance between the TE mode and the TM mode is proportionately small. Moreover, since the return light can be coupled to a greater extent with the semiconductor laser interior, the semiconductor laser is allowed to produce the radiation of TM mode as well as that of TE mode.

Now, a preferred embodiment of the present invention will be described below.

A transverse-junction-stripe GaAlAs laser (having a wavelength of about 830 nm and a threshold current of about 30 mA) (Mitsubishi model ML-2307) was mounted with the plane of the p-n junction falling opposite the heatsink. On the opposite end faces of this laser, silicon nitride was deposited by the plasma chemical vapor deposition method to a thickness equaling about one quarter of the wavelength, to produce an antireflection coat. The residual reflectance of the opposite end faces was about 0.05.

A semiconductor laser device of the construction of FIG. 1 was set up by using the semiconductor laser 10 constructed as described above. VP4825-2 and VP4560NC, lenses made by Olympus Optical Industry (Ltd.) were used as the lenses 32, 33, a multi-layer vacuum deposited film of dielectric made by Nippon Vacuum Optical (Ltd.) (having a reflectance of 1.0) was used as the mirror 31, and an antireflection polarizing prism made by CVI Laser Corp. of the U.S. and adapted to be rotated about the optical axis was used as the element 34 for controlling the polarization characteristics of the return light.

To the semiconductor laser, an electric current of about 40 mA was injected. The laser beam radiated through the outlet end face 13 was reflected by the mirror 31. The return beam was projected to the output end face 13, with the direction of polarization $\theta$ thereof varied to 0°, 47°, and 90°, respectively, relative to the plane of the p-n junction. Consequently, the end face 13' of the semiconductor laser 10 radiated a laser beam. This laser beam was collimated by use of the lens. The collimated laser beam was split by the polarizing prism into two components of the polarized beam of TE mode and TM mode. By means of a light detector, the two components of the polarized beam were measured for optical intensity.

Figure 5A:
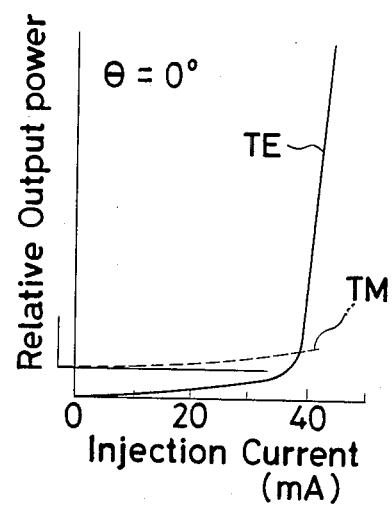
FIGS. 5(A), 5(B) and 5(C) are graphs showing the relation between the direction of the polarization of the return light and the intensities of TE mode and TM mode in the output laser beam.
Figure 5B:
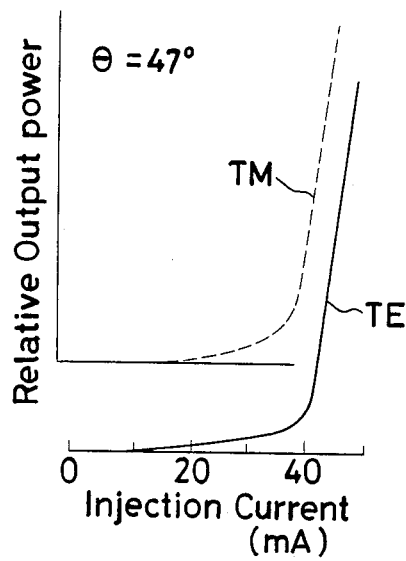
Figure 5C:
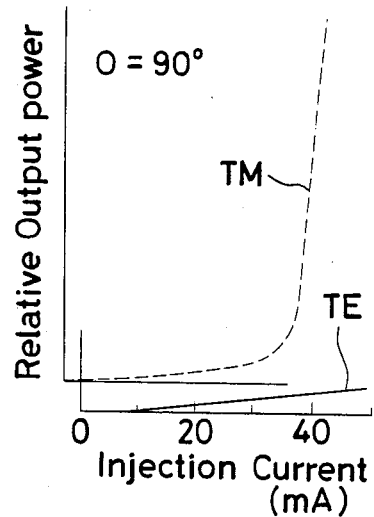

The results of the measurement are shown in FIGS. 5(A), 5(B) and 5(C). In each of the graphs, the horizontal axis is the scale for injection current and the vertical axis is the scale for relative value of light output. Where $\theta=0°$, only TE mode gained in growth as shown in FIG. 5(A). In this case, the threshold current of the laser radiation was about 38 mA and the maximum polarization ratio was not less than 100 to 1. Where $\theta=47°$, both TE mode and TM mode were obtained at substantially equal light intensities and threshold currents of about 40 mA as illustrated in FIG. 5(B). In this case, the polarization ratio was 1 to 1. Where $\theta=90°$, only TM mode gained in growth as illustrated in FIG. 5(C). In this case, the threshold current was about 42 mA. The threshold current of radiation in the absolute absence of return light is about 68 mA.

In accordance with the present invention, a semiconductor laser device which permits the direction of polarization of the output laser beam to be readily changed can be materialized as described above. Naturally, the speed at which the direction of polarization of the output laser beam can be changed is restricted by the characteristics of the element 34 serving to control the plane of polarization of the return light. By the method which resorts to mechanical rotation of the aforementioned polarizing prism, the speed of response obtainable is on the order of some hundreds of mS.

In the self-coupling effects of the semiconductor laser 10, the speed of response of the laser radiation by the return light is determined by the size of the optical system 30 used for producing the return light and the time required for the growth of stimulated emission of the semiconductor laser 10. The speed actually obtainable by this invention is less than several nS. The direction of the polarization of output light of the semiconductor laser 10, therefore, can be changed at an extremely high speed by adopting an element which is capable of changing the direction of polarization of the return light at an extremely high speed. For this purpose, a polarization modulating element using an electro-optic crystal such as, KDP or $LiNbO_3$ can be adopted advantageously.

In this case, it is important that the opposite end faces of the electro-optic crystal should be provided with antireflection coating or they should be given Brewster angles by polishing so as to avoid producing unnecessary reflected light. When such electro-optic crystals are adopted as bulk elements, the voltage necessary for the modulation of polarization generally amounts to some kV. To obtain the operation at a lower voltage, a modulation element of the type of an optical waveguide can be advantageously used.

An embodiment wherein the aforementioned $LiNbO_3$ was used as an element for controlling the polarization characteristics of the return light will be described below with reference to FIG. 6.

A semiconductor laser 11 used herein was the same as that used in the preceding embodiment. As the element 34 for controlling the plane of polarization of the return light, a Z-cut $LiNbO_3$ crystal 2 mm square by 25 mm long was used. To permit application of potential to the crystal, the upper and lower sides of the crystal had electrodes 35' and 35" deposited thereon by vacuum evaporation. One side of the LiNbO₃ crystal 34 was covered with antireflection coating 14' and the other side with dielectric multilayers having 99% of reflectivity and serving as a reflective mirror 31. By the application of potential to the LiNbO₃ crystal of the construction described above, the plane of polarization of the laser beam passing through the crystal can be modulated. The energy resulting from application of an electric current to the semiconductor laser 11 through the electrodes 12 and 12', is intensified between the opposite end faces 13 and 13' constituting the laser resonator, and then emitted through the end faces in the form of a laser beam. The forward laser beam 15F emitted through one of the end faces, 14, passes into the polarization control element 34 through a lens 32. The rear laser beam 15R passes into either of photosensors PD1 and PD2 such as a photodiode through a lens 32' and a prism P.

Figure 7A:
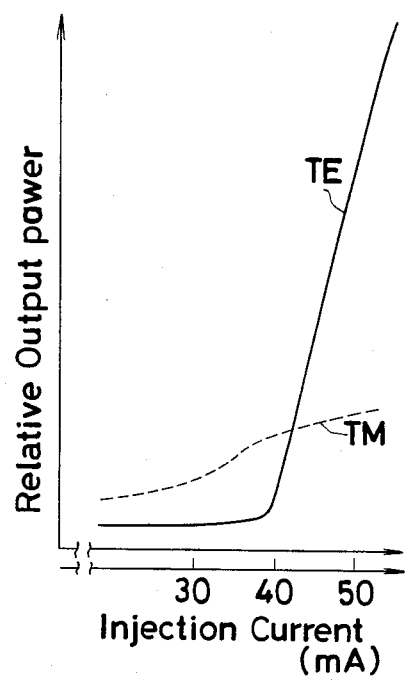
FIGS. 7(A) and 7(B) are graphs showing the relation between the injection power and the output light.
Figure 7B:
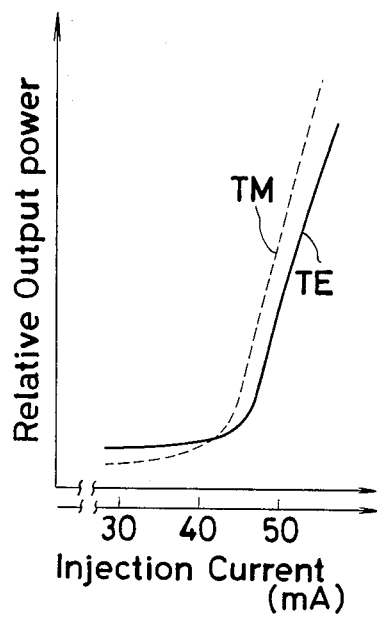

FIG. 7(A) represents the characteristic curve of injection current vs. light output obtained in the absence of the application of potential to the aforementioned LiNbO₃ crystal and FIG. 7(B) represents the characteristic curve of injection current vs. light output obtained under application of a potential of 300 V. From these graphs, it is noted that the radiation from the semiconductor laser occurred only in the TE mode where no potential was applied to the crystal, whereas the radiation occurred simultaneously in the TE mode and the TM mode where the potential of 300 V was applied to the crystal.

Figure 8:
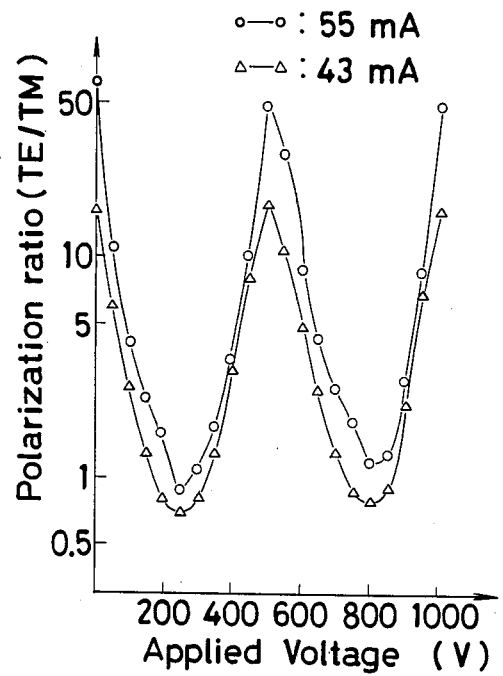
FIG. 8 is a graph showing the characteristic curve of the polarization ratio as a function of the applied voltage, with the injection current as the parameter.

FIG. 8 graphically shows the relation between the polarization ratio defined by the intensity ratio of the TE to TM mode components and the voltage applied to the LiNbO₃ crystal, with the injection current used as the parameter. From this graph, it is noted that the polarization ratio of the TE mode exceeded 60.

Figure 9:
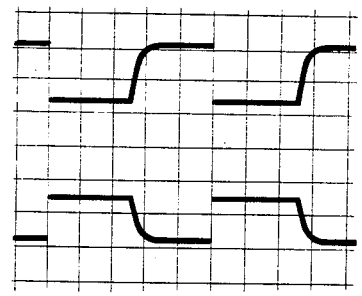
FIG. 9 is a graph illustrating the switching characteristics of TE mode and TM mode relative to the applied voltage pulse.

FIG. 9 graphically shows the switching characteristics of the TE mode (the upper trace) and the TM mode (the lower trace) in terms of waveform obtained when an input pulse of 100 volts and 200 μs duration was applied to the LiNbO₃ crystal. From this graph, it is noted that the TM mode rose in proportion as the TE mode fell and vice versa. The response time was not so short as would be expected from the use of the LiNbO₃ crystal. The response time was affected rather by the electronic circuit than by the self-coupling effects.

Measures available for providing antireflection coating for the opposite end faces of the semiconductor laser include forming a film of silicon oxide or aluminum oxide, using some other transparent dielectric superposing a transparent dielectric in a multiplicity of layers for the purpose of further enhancing the antireflecting property as well as forming the film of silicon nitride as described previously.

Figure 10:
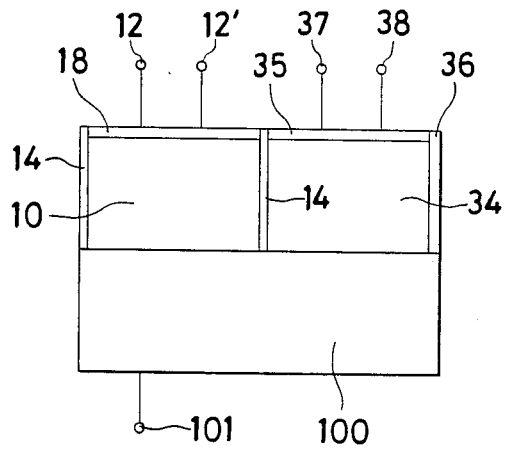
FIG. 10 is a side view illustrating a typical configuration of the semiconductor laser device of the present invention.

An embodiment of this invention in which the element for controlling the polarization characteristics of the return light and the semiconductor laser are formed on one and the same substrate is illustrated in FIG. 10. As shown in the diagram, a semiconductor laser 10 and an element 34 for controlling the polarization characteristics of the return light are integrally formed on one common substrate 100. Methods available for the formation of this composite element may be broadly divided into the following three types.

(i) An insulating material such as, for example, insulating silicon is used as the common substrate 100. The semiconductor laser 10 and the element 34 for the control of the polarization characteristics of the return light are separately manufactured. They are then mounted on the common substrate 100. The semiconductor laser 10 comprises a p-n junction 18, antireflection coated end faces 14, 14', and electrode terminals serving to admit the injection current. It is mounted on the common substrate 100 with the p-n junction 18 falling on the upper side. The element 34 for the control of the polarization characteristics of the return light comprises an optical waveguide 35 made of an electro-optic crystal such as, for example, LiNbO₃ and possessed of a polarization modulating property, a high-reflectance end face 36, and electrodes 37, 38 serving to modulate the plane of polarization of the light passing through the optical waveguide 35. The semiconductor laser 10 and the element 34 are mounted on the common substrate 100 in such a manner that the optical axis of the optical waveguide 35 for the p-n junction 18 in the semiconductor laser 10 may coincide with the optical axis of the optical waveguide 35 of the element 34 for the control of the polarization characteristics of the return light.

(ii) A semiconductor is used as the common substrate 100. A semiconductor laser 10 is fabricated on this common substrate 100. Then, the portion of the common substrate on which an element 34 for the control of the polarization characteristics of the return light is to be mounted is removed by the technique of etching. Subsequently, the end faces of the crystal is treated for antireflection coating. Finally, the element 34 for controlling the polarization characteristics of the return light is mounted on the common substrate in much the same way as in (i) above. In this construction, the upper electrode terminals 12 and 12' and the lower electrode terminal 101 can be utilized for the injection of current to the semiconductor laser 10.

(iii) A semiconductor is used as the common substrate 100. A semiconductor laser 10 is caused to grow selectively in the upper lefthand side of the common substrate 100. An element 34 for the control of the polarization characteristics of the return light is caused to grow selectively in the upper righthand side of the substrate.

Of the three major methods described above, the methods of (i) and (ii) involve use of a hybrid element between a semiconductor and an electro-optic crystal preponderantly of a dielectric. The method of (iii) involves use of a monolithic element formed solely of a semiconductor. In the case of a monolithic element used in the method of (iii), the manufacture of the element is effected by using a device integrally comprising a molecular beam-epitaxy crystal growing unit and an ion injection unit or molecular beam mass analyzer.

Since the electro-optic effects of the compound semiconductor crystal are less powerful than those of the dielectric some device or other may be required in conferring a polarization modulating property upon the semiconductor crystal.

Figure 6:
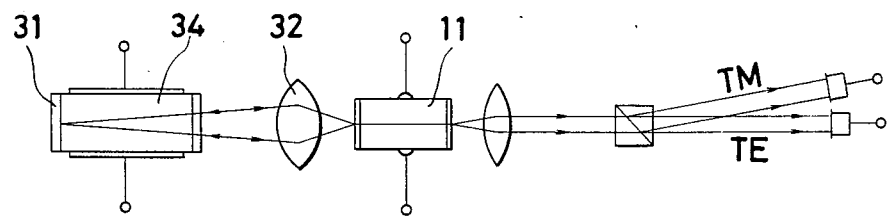
FIG. 6 is a block diagram illustrating another typical construction of the semiconductor laser device of the present invention.

When the element illustrated in FIG. 6 is adopted, the semiconductor laser device can be made in a very small size and it permits the plane of polarization to be modulated at a very high speed. When the hybrid or monolithic element is adopted, it provides highly reliable performance because it is not affected by external shocks.

As described in detail above, the present invention uses a semiconductor laser of the type having antireflection coating on the opposite end faces, sets this semiconductor laser in position within an optical system adapted to induce self-coupling effects of the laser, and disposes in this optical system an element for controlling the polarization characteristics of the return light to the semiconductor laser. It thus permits selective utilization of either of the two straight polarized beams whose directions of polarization mutually intersect perpendicularly or simultaneous utilization of both of the beams. The semiconductor laser device of this invention is further capable of switching the two straight polarized beams at an extremely high speed. With this semiconductor laser device, the polarization ratio of the two straight polarized beams is several times as high as that of the polarized beams of the conventional semiconductor laser device. When it is used as the light source for optical communication or measurement, the transmission, collection and processing of information at a higher SN ratio can be advantageously materialized. When the semiconductor laser device is used in combination with a polarization preserving optical fiber, it is expected to increase the volume of data transfer, render confidential communication and multi-functional optical communication feasible, and expand the utility of optical fiber interferometers. Thus, the present invention contributes immensely to the advance of the optical data industry.

What is claimed is:

1. A semiconductor laser device, comprising a semiconductor laser having a semiconductor containing a p-n junction and opposite output end faces constituting a laser resonator, said end faces provided with an antireflection coating having a reflectance at said end faces less than 0.1, a power source for controlling the injection current to said semiconductor laser so that the semiconductor laser emits a laser beam, an optical system arranged so as to reflect and return the beam emitted from one of said output end faces of said semiconductor laser back to said one of said output end faces thereby inducing self-coupling effects of said laser, and an element for controlling the polarization characteristics of the laser beam reflected by said optical system.

2. A semiconductor laser device according to claim 1, wherein said element for controlling the polarization characteristics of said laser beam reflected by said optical system comprises a polarization plane control element of the form of an optical waveguide.

3. A semiconductor laser device according to claim 2, wherein said polarization plane control element of the form of an optical waveguide is formed integrally with said semiconductor laser on a common substrate.

* * * * *